United States Patent

Graziadei et al.

[11] Patent Number: 4,872,206
[45] Date of Patent: Oct. 3, 1989

[54] MIXER DYNAMIC CONTROL

[75] Inventors: Rinaldo Graziadei, Monza; Giorgio Rossi, Nerviano, both of Italy

[73] Assignee: SGS-Thomson Microelectronics s.r.l., Italy

[21] Appl. No.: 175,994

[22] Filed: Mar. 31, 1988

[30] Foreign Application Priority Data

Apr. 13, 1987 [IT] Italy ............................ 83617 A/87

[51] Int. Cl.$^4$ ............................................. H04B 1/26
[52] U.S. Cl. ................................... 455/241; 455/246; 455/251
[58] Field of Search ............... 455/234, 239, 241, 245, 455/247, 246, 251, 315; 375/98

[56] References Cited

U.S. PATENT DOCUMENTS

| 3,495,244 | 2/1970 | La Rosa ............................. 375/98 |
| 3,665,317 | 5/1972 | Crow .................................. 455/251 |
| 4,121,161 | 10/1978 | Ohsawa ............................... 455/234 |
| 4,455,681 | 1/1984 | Wile ..................................... 455/246 |
| 4,538,300 | 8/1985 | Richards, Jr. ...................... 455/245 |
| 4,580,288 | 4/1986 | Rinderle ............................. 455/247 |
| 4,776,040 | 10/1988 | Ichikawa et al. .................. 455/315 |

Primary Examiner—Robert L. Griffin
Assistant Examiner—Curtis Kuntz
Attorney, Agent, or Firm—Pollock, Vande Sande & Priddy

[57] ABSTRACT

A mixer dynamic control (MDC) system for an AM superheterodyne receiver prevents saturation of the mixer stage caused by out-of-tune signals much more effectively than a so-called wide band RF-AGC system of the known art. The system contemplates detecting the converted IF signal before the band filter, amplifying the detected signal, extracting the dc component thereof and summing such a dc component to a dc control signal generated by a narrow band AGC and applying such a sum signal in lieu of the sole narrow band AGC system's control signal.

2 Claims, 3 Drawing Sheets

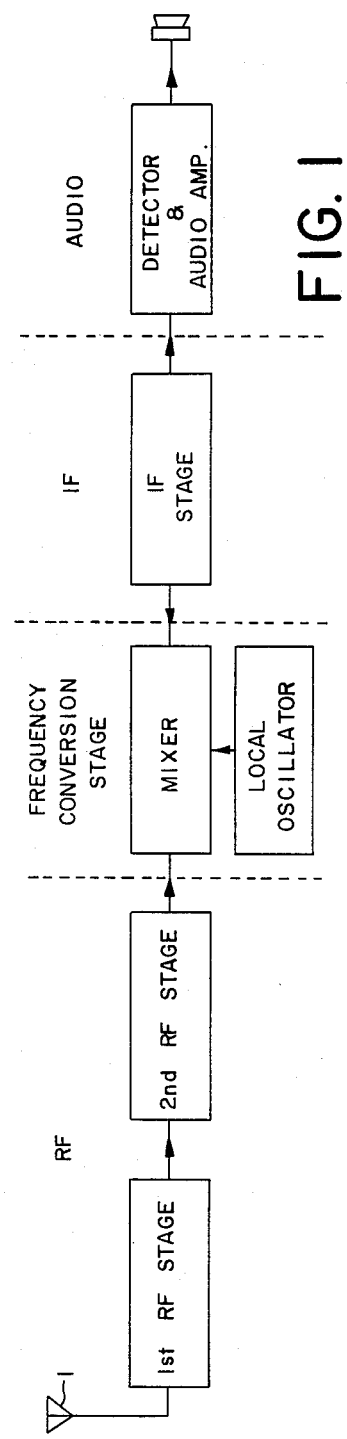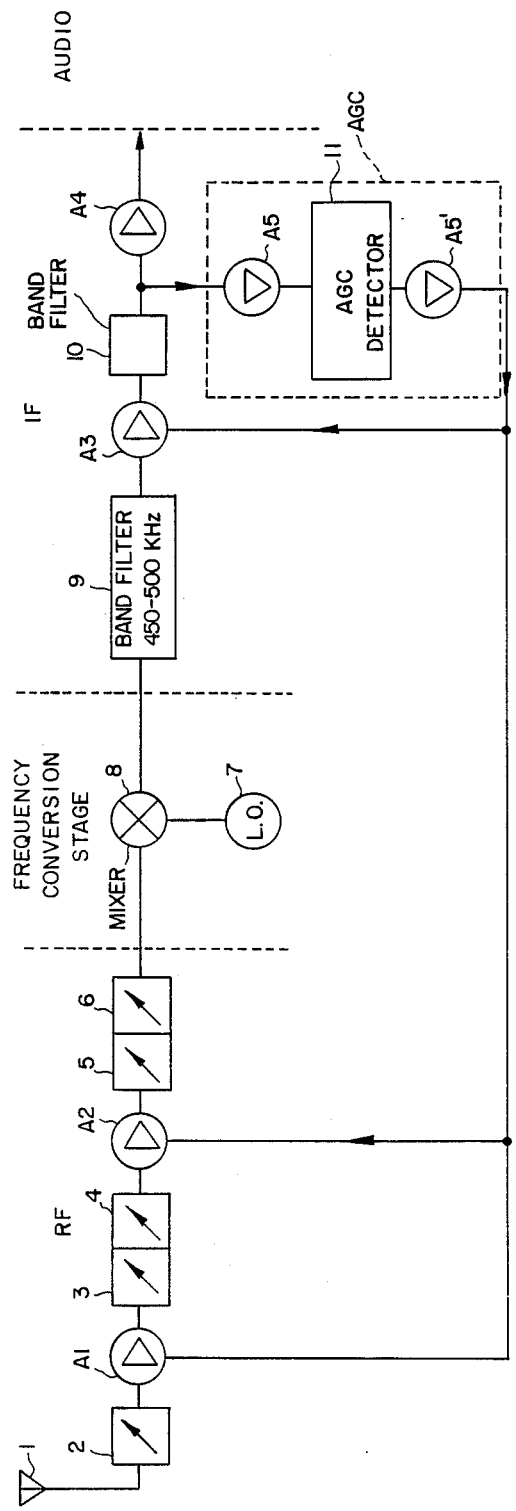

MIXER DYNAMIC CONTROL

BACKGROUND OF THE INVENTION

1. Field of the Invention

The present invention relates to AM radio broadcast receivers or AM (Amplitude Modulation) tuners. IN in particular, the invention relates to a method and to a relative circuit for preventing the generation of high frequency harmonics (tweet) when the receiver is out of tuning, i.e. when searching for broadcasting stations.

2. Description of the Prior Art

In AM receivers of a certain quality, a single or a double conversion superheterodyne circuit is invariably used.

In these receivers also invariably present is an automatic gain control (AGC) circuit, whose primary function is to keep the signal output of the amplifier (receiver) at a substantially constant level, i.e. a constant audio output for changing antenna's signal levels.

Such a gain control is automatically actuated, in the sense that when the receiver is tuned to a strong signal broadcasting station, the modulation signal received is instrumental in decreasing the gain of the receiver by decreasing the gain of the amplifying stages; conversely the gain is maximum when the signal received is very weak.

The automatic gain control permits maintaining a constant audio intensity reproduction notwithstanding the fact that the incoming electromagnetic signal has a continuously varying intensity because of propagation irregularities, especially in the case of distant broadcasting stations. In the absence of such an automatic gain control, the reception would be subject to continuous fluctuations (fading) and for this reason the automatic gain control is also often called antifading control. Another advantage of the AGC is the reduction of local disturbances when listening to nearby or powerful broadcasting stations.

The AGC is realized by detecting the modulated signal in the intermediate frequency (IF) stage of the receiver and extracting from the modulation envelope, by means of a suitable filter, the dc component of the modulating signal. The dc component is sensibly proportional to the amplitude of the carrier signal and therefore may be utilized for automatically adjusting the gain of the amplifying stages of the IF stage and, preferably, also the gain of the amplifying stages of the radio frequency (RF) stage. Therefore, when the receiver is tuned, the dc component of the detected signal is applied as an adjustment bias voltage or current to the various amplifying stages for reducing the gain and for keeping compressed the modulated signal going through the tuner stages so as to keep an appropriate dynamic range throughout the receiver and in particular in the mixer stage.

Obviously such an AGC system is incapable of intervening when the receiver is out of tuning, for example during the search for broadcasting stations. In practice, the AGC functions only when the amplitude of the received signal is above a certain minimum value (threshold value) so as to leave available the full sensitivity (gain) of the receiver when the incoming signal is very weak.

The dc component of the detected signal of the AGC system is also often used for driving a tuning indicator, i.e. a visual display of the actual tuning degree.

On the other hand, it is very desirable that the mixer of the receiver (i.e. the signal converting stage from a high frequency (RF) signal to an intermediate frequency (IF) signal) be kept in a proper dynamic working range in all conditions, especially when the receiver is out of tuning in order to optimize the performances of the system in terms of intermodulation and cross modulation.

According to the present art, often used is a second, distinct, automatic gain control system, commonly known as wide band RF-AGC, in the radio frequency stage of the receiver.

For distinguishing the two separate automatic gain control systems, the traditional AGC system already described is often referred to as narrow band AGC.

Different from the narrow band AGC, the intervention of the RF-AGC system consists in attenuating excessively strong signals which exceed the dynamic range of the RF stage, without discriminating between in-tune and out-of-tune signals. Such a type of intervention has undoubtedly disadvantageous aspects.

SUMMARY OF THE INVENTION

A main objective of the present invention is to provide a method and a relative circuit for controlling the dynamics of the mixer stage of an AM receiver in an improved manner in respect to the known systems using a narrow band AGC and, eventually, also a wide band RF-AGC.

The system of the present invention contemplates the use of an automatic control circuit of the mixer stage dynamic (hereinafter also referred to by means of the acronym MDC, from Mixer-Dynamic-Control), sensitive to the level of the dc component of the purposely detected intermediate frequency signal, detected before the filter. Such a dc signal, suitably amplified is summed to the signal generated by the narrow band AGC circuit and the resulting signal is used for controlling the dynamics of the RF amplifying stages (before the mixer) and, optionally, also of IF amplifying stages before the detector of the narrow band AGC circuit.

Different from the known systems utilizing the so called wide band RF-AGC, the system of the present invention or MDC, lends itself to optimize the attenuating action upon spurious signals near the sides of the tuning (narrow band) characteristic curve.

In other words, the receiver of the present invention utilizes a conventional narrow band AGC system for controlling the dynamic of the various stages of the receiver for in-tune signals; but is additionally provided with a mixer dynamin control system (MDC) which "substitutes" the AGC system for substantially out-of-tune signals.

Eventually the receiver may also be provided with a wide band RF-AGC in the RF input stage. Advantageously, the intervention characteristics of the wide band RF-AGC system may be adjusted in such a way as to have a compressing effect upon the incoming signals complementing the effects of the narrow band AGC system and of the new MDC system object of the instant invention.

BRIEF DESCRIPTION OF THE DRAWINGS

The invention and the advantages thereof in respect to the prior art will be more easily illustrated with reference to the annexed drawings, wherein:

FIG. 1 is a block diagram of a superheterodyne receiver;

FIG. 2 shows a block diagram of the RF section, mixer stage and IF section of the receiver of FIG. 1, with the AGC system brought in evidence;

DESCRIPTION OF PREFERRED EMBODIMENTS

Figure 3:
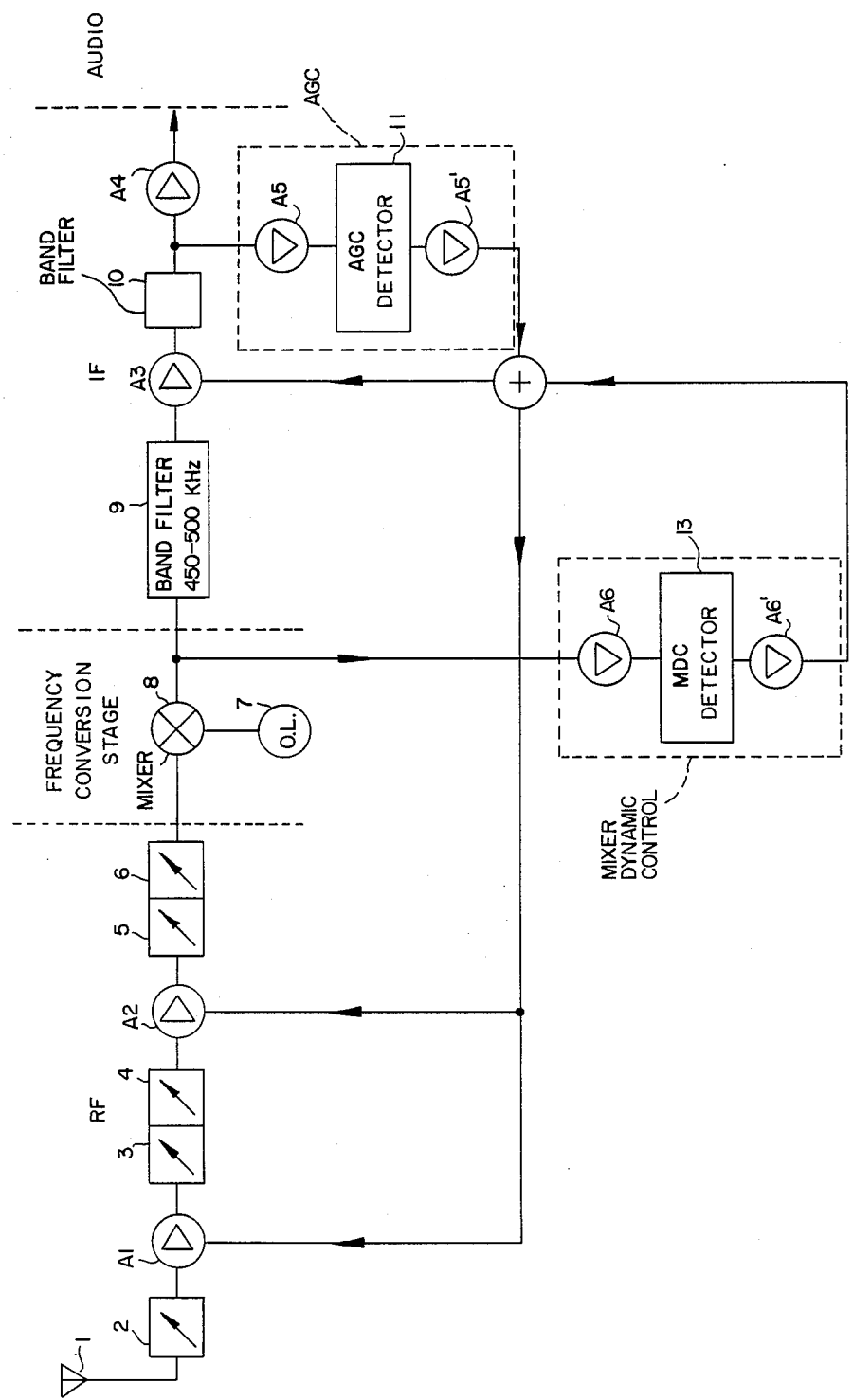
FIG. 3 is a block diagram of the receiver of the preceding figures incorporating the MDC system of the present invention.

With reference to FIGS. 1 and 2, a typical superheterodyne receiver comprises an input RF section which may contain one or more wide band amplifiers (A1 and A2), suitably coupled, respectively to the antenna 1 and among themselves by means of appropriate LC resonant coupling networks 2, 3, 4, 5 and 6.

The RF section, besides amplifying the signals received by the antenna 1, has the function of a preselector stage, i.e. capable of eliminating the image frequency $f*_1$, which differs from the tuning frequency $f_1$ by $2f_i$ (i.e. twice the intermediate frequency).

The frequency conversion stage is formed by a tunable local oscillator 7 (or frequency synthesizer) and by a mixer stage 8. The IF stage provides further amplification of the IF signal and determines the selectivity of the receiver by means of one or more band filters 9 and 10, tuned to the selected intermediate frequency ($f_i$) whose value, conventionally, is comprised between 300 and 600 kHz; the most used values being comprised between 450 and 500 kHz. The modulated IF signal, filtered and amplified, is fed to the audio section of the receiver which comprises a detection stage, a preamplifier stage and a final power amplifier stage.

The narrow band AGC system of the receiver utilizes the modulated IF signal (after having been filtered by the band filters 9 and 10). After an optional isolation stage by means of a suitable amplifier A5, the IF signal is detected by a detector 11 and preferably amplified by means of an amplifier A5 to prevent loading the detector.

The detected dc signal is applied to the bias network of the preceding amplifying stages (A3, A2 and A1) in order to control the dynamic characteristics thereof, thus avoiding that the stages be driven into saturation by excessively strong signals.

Obviously the narrow band AGC system exerts its control upon the dynamic of the various stages of the receiver exclusively for signals comprised within the tuning band (in other words the signals out-of-tune do not contribute in any way to generating a dc control signal of the AGC system).

On the other hand as already discussed in the preamble, the use according to the known art of a wide band RF-AGC system in the RF section to supplement the action of the narrow band AGC system, because of the peculiarity of being a wide band system, is unable to provide an effective intervention upon signals immediately outside the tuning band and more particularly upon those signals of such a frequency as to cause intermodulation and crossmodulation problems.

FIG. 3 depicts a block diagram of the same receiver shown in FIG. 2 to which the mixer dynamic control (MDC) system of the invention is applied. In FIG. 3 the same numbers used in FIG. 2 indicate the same parts of the receiver.

As it is observed in the block diagram of FIG. 3, the system of the invention contemplates the detection, after an eventual isolation stage A6, of the frequency converted modulated signals before they are filtered by the band filters 9 and 10 of the IF section of the receiver. The dc signal detected by means of a suitable detector 13 and preferably amplified by an isolation amplifier A6', is summed to the dc control signal produced by the existing narrow band AGC system.

As easily understood by a skilled technician, when the receiver is tuned, the control signal produced by the narrow band AGC system has a much higher level than the control signal produced by the MDC system and therefore it may be said that, when the receiver is tuned, it is the narrow band AGC system exerting predominantly the dynamic control of the preceding stages, conversely, when the receiver is out-of-tune, and therefore the AGC system ceases to exert its function of automatic control of the gain because the control signal produced by the AGC system becomes substantially null, the MDC system continues to produce a control signal of a level sufficient to maintain a correct dynamic within the RF stages for out-of-tune signals, thus preventing the mixer stage 8 from being driven to a saturation condition.

This besides improving the performances of the receiver in terms of intermodulation and crossmodulation, and producing a remarkable improvement as far as tweet performance at $2f_i$ and at $3f_i$ is concerned, permits a much more pleasant tuning.

Figure 4:
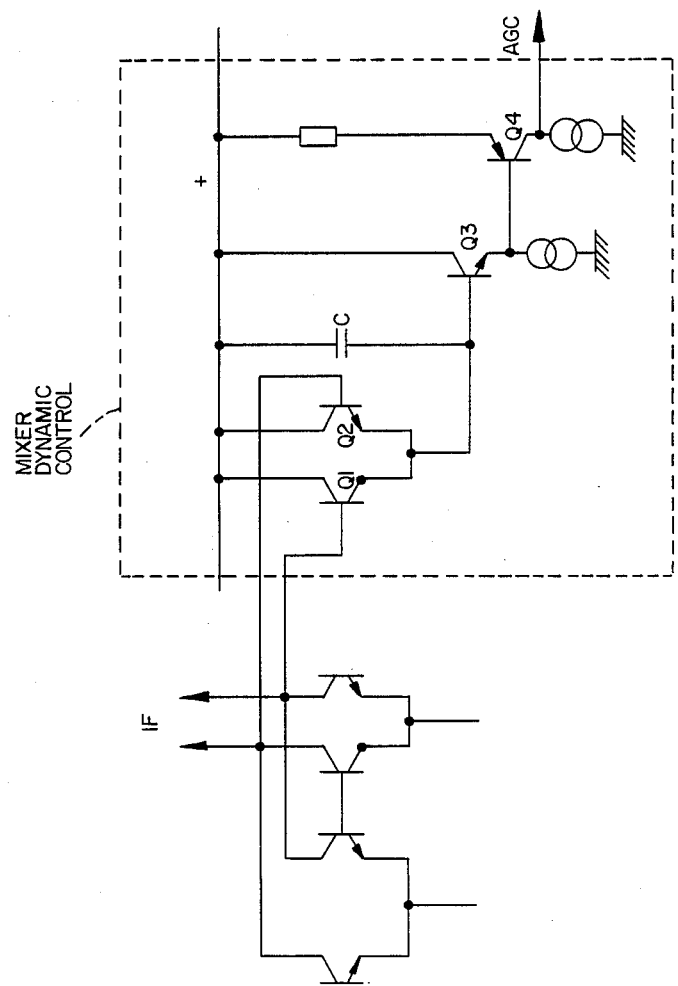
FIG. 4 is a simplified electric diagram of an MDC circuit which may be easily integrated.

FIG. 4 shows an embodiment of an MDC circuit of the present invention which may be easily integrated.

The circuit shown in FIG. 4 is relative to an integrated embodiment of an AM receiver utilizing a differential handling of signals. As it may be observed, the signal (in differential form) coming from the mixer stage and destined to the IF stage, is detected by the pair of transistors Q1 and Q2 and by the capacitor C, and the detected signal is coupled by means of a follower stage Q3 to prevent loading the detector, to an amplifier stage Q4 which amplifies the detected signal and feeds it to a node of application of a control signal of a conventional narrow band AGC system.

We claim:

1. A method for controlling dynamics of a mixer stage of an AM receivewr including at least an RF stage, a local oscillator, a mixer stage having inputs for receiving an output signal of the RF stage and a signal generated by said local oscillator, the output signal of the mixer stage being fed to an input of an IF stage, and a narrow band AGC circuit sensing the amplitude of an IF signal from the IF stage and generating a dc control signal which is applied to a biasing network of at least a signal amplifier of the RF stage for modifying the bias conditions and reducing the gain thereof, said method comprising the steps of:

detecting the amplitude of the output signal of the mixer stage by means of a detector, which generates a dc output signal being a function of this amplitude;

amplifying the detected dc output signal and applying it to a summing node;

combining the amplified dc output signal from the detector with the dc control signal generated by the narrow band AGC circuit which is also applied to the summing node; and supplying the resulting combined signal to at least a biasing network of at least a signal amplifier of the RF stage for modifying the bias conditions and reducing the gain for maintaining the mixer stage operating within an appropriate dynamic range under tuning and out-of-tune conditions of the receiver;

wherein the combined signal value is defined substantially by the dc control signal generated by the narrow band AGC circuit under tuning conditions and by the dc output signal from the detector during out-of-tune conditions of the receiver.

2. A circuit for controlling dynamics of a mixer stage of an AM receiver including at least an RF stage, a local oscillator, a mixer stage having inputs for receiving an output signal of the RF stage and a signal generated by the local oscillator, the output signal of the mixer stage being fed to an input of an IF stage, and a narrow band AGC circuit sensing the amplitude of an IF signal from the IF stage and generating a dc control signal which is applied to a biasing network of at least a signal amplifier of the RF stage for modifying the bias conditions and reducing the gain thereof, said circuit comprising:

at least a level detector for detecting the amplitude of the output signal of the mixer stage; and generating a dc output signal being the function of this amplitude;

an amplifier for amplifying the dc output signal detected by the detector;

a summing node for receiving and combining the amplified dc output signal from the detector and the dc control signal generated by the narrow band AGC circuit, the resulting combined signal being supplied to a biasing network of at least a signal amplifier of the RF stage for modifying the bias condition and reducing the gain thereof for maintaining the mixer stage operating within the appropriate dynamic range under tuning and out-of-tune conditions of the receiver; and wherein the combined signal value is defined substantially by the dc control signal generated by the narrow band AGC circuit under tuning conditions, and by the dc output signal from the detector during out of tune conditions of the receiver.

* * * * *